(12) United States Patent
Sakurai

(10) Patent No.: US 10,965,013 B2
(45) Date of Patent: Mar. 30, 2021

(54) ANTENNA MODULE

(71) Applicant: KYOCERA Corporation, Kyoto (JP)

(72) Inventor: Keizou Sakurai, Yasu (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 16/463,842

(22) PCT Filed: Nov. 30, 2017

(86) PCT No.: PCT/JP2017/043057
§ 371 (c)(1),
(2) Date: May 23, 2019

(87) PCT Pub. No.: WO2018/116781
PCT Pub. Date: Jun. 28, 2018

(65) Prior Publication Data
US 2019/0334231 A1    Oct. 31, 2019

(30) Foreign Application Priority Data
Dec. 20, 2016    (JP) .............................. JP2016-246226

(51) Int. Cl.
*H01Q 1/38*    (2006.01)
*H01L 23/66*    (2006.01)
(Continued)

(52) U.S. Cl.
CPC .............. *H01Q 1/38* (2013.01); *H01L 23/66* (2013.01); *H01Q 21/06* (2013.01); *H01Q 23/00* (2013.01);
(Continued)

(58) Field of Classification Search
CPC .......... H01Q 21/06; H01Q 23/00; H01Q 1/38; H01Q 1/2283; H01Q 21/065;
(Continued)

(56) References Cited

U.S. PATENT DOCUMENTS

2016/0049723 A1    2/2016    Baks et al.
2016/0224061 A1*    8/2016    Noda ................... G06F 1/1637

FOREIGN PATENT DOCUMENTS

JP    02-256305 A    10/1990
JP    2000-138525 A    5/2000
(Continued)

*Primary Examiner* — Daniel D Chang
(74) *Attorney, Agent, or Firm* — Volpe Koenig

(57) ABSTRACT

An antenna module of the present disclosure includes a control substrate having a flat plate shape and configured to house or mount a semiconductor element; a frame substrate bonded to an upper surface of the control substrate via bonding members and exposing a center portion of the upper surface of the control substrate; and an antenna substrate having a flat plate shape, bonded to an upper surface of the frame substrate via the bonding members so as to face the control substrate, and provided with a plurality of antenna patterns disposed along a main surface of the antenna substrate. The frame substrate includes a frame main body and a crosspiece. Between the frame main body/the crosspiece and the control substrate as well as the antenna substrate, projecting portions that come into contact with the opposing control substrate, frame substrate, and antenna substrate are provided at a fixed height.

11 Claims, 10 Drawing Sheets

(51) Int. Cl.
  *H01Q 21/06* (2006.01)
  *H01Q 23/00* (2006.01)
  *H05K 1/14* (2006.01)
  *H05K 3/28* (2006.01)
(52) U.S. Cl.
  CPC ............... *H05K 1/144* (2013.01); *H05K 3/28* (2013.01); *H01L 2223/6677* (2013.01); *H05K 2201/20* (2013.01)
(58) Field of Classification Search
  CPC .................. H01Q 9/0457; H01L 23/66; H01L 2223/6677; H05K 1/144; H05K 3/28; H05K 2201/20; H05K 1/14
  See application file for complete search history.

(56) References Cited

FOREIGN PATENT DOCUMENTS

JP    2004-327641 A    11/2004
JP    2016-143757 A    8/2016

\* cited by examiner

ANTENNA MODULE

TECHNICAL FIELD

The present disclosure relates to an antenna module.

BACKGROUND ART

An antenna module includes a control substrate, a frame substrate, and an antenna substrate. The control substrate, the frame substrate, and the antenna substrate are bonded via a bonding member. The bonding member is, for example, solder. Examples of such an antenna module include that in Patent Document 1.

According to the antenna module in the related art, variations may occur in a thickness of the bonding member made from solder, and warping may occur in the antenna substrate. As a result, a spacing and parallelism between the control substrate and the antenna substrate have been susceptible to variation. When variations occur in a distance and/or the parallelism between the control substrate and the antenna substrate, a significant variation occurs in frequency characteristics of the antenna module, making it no longer possible to favorably transmit and receive high-frequency signals in a desired frequency bandwidth.

CITATION LIST

Patent Literature

Patent Document 1: JP 2004-327641 A

SUMMARY OF INVENTION

An antenna module according to a first aspect of the present disclosure includes a control substrate, a frame substrate, and an antenna substrate. The control substrate has a flat plate shape and is configured to house or mount a semiconductor element. The frame substrate is positioned on an upper surface of the control substrate via a bonding member and exposes a center portion of the upper surface of the control substrate. The antenna substrate is positioned on an upper surface of the frame substrate via a bonding member so as to face the control substrate. The antenna substrate has a flat plate shape and is provided with a plurality of antenna patterns positioned on an upper surface and a lower surface thereof. The frame substrate includes a frame main body having a frame shape along an outer peripheral portion of the control substrate; and a crosspiece for reinforcement extending across an area defined by an inner periphery of the frame main body. The frame substrate further includes, on the frame main body and the crosspiece, a plurality of projecting portions that come into contact with the control substrate at a fixed height; and a plurality of projecting portions that come into contact with the antenna substrate at a fixed height.

An antenna module according to a second aspect of the present disclosure includes a control substrate, a frame substrate, and an antenna substrate. The control substrate has a flat plate shape and is configured to house or mount a semiconductor element. The frame substrate is bonded to an upper surface of the control substrate via a bonding member and exposes a center portion of the upper surface of the control substrate. The antenna substrate is positioned on an upper surface of the frame substrate via a bonding member so as to face the control substrate. The antenna substrate has a flat plate shape and is provided with a plurality of antenna patterns positioned on an upper surface and a lower surface thereof. The frame substrate includes a frame main body having a frame shape along an outer peripheral portion of the control substrate; and a crosspiece for reinforcement extending across an area defined by an inner periphery of the frame main body. The control substrate and the antenna substrate each include, on a surface facing the frame substrate, a plurality of projecting portions that come into contact with the frame main body and the crosspiece at a fixed height.

An antenna module according to a third aspect of the present disclosure includes a control substrate, a frame substrate, and an antenna substrate. The control substrate has a flat plate shape and is configured to house or mount a semiconductor element. The frame substrate is bonded to an upper surface of the control substrate via a bonding member and exposes a center portion of the upper surface of the control substrate. The antenna substrate is positioned on an upper surface of the frame substrate via a bonding member so as to face the control substrate. The antenna substrate has a flat plate shape and is provided with a plurality of antenna patterns positioned on an upper surface and a lower surface thereof. The frame substrate includes a frame main body having a frame shape along an outer peripheral portion of the control substrate; and a crosspiece for reinforcement extending across an area defined by an inner periphery of the frame main body. The frame substrate further includes, on upper surfaces of the frame main body and the crosspiece, a plurality of projecting portions that come into contact with the antenna substrate at a fixed height. The control substrate includes, on the upper surface thereof, a plurality of projecting portions that come into contact with the frame main body and the crosspiece at a fixed height.

An antenna module according to a fourth aspect of the present disclosure includes a control substrate, a frame substrate, and an antenna substrate. The control substrate has a flat plate shape and is configured to house or mount a semiconductor element. The frame substrate is bonded to an upper surface of the control substrate via a bonding member and exposes a center portion of the upper surface of the control substrate. The antenna substrate is positioned on an upper surface of the frame substrate via a bonding member so as to face the control substrate. The antenna substrate has a flat plate shape and is provided with a plurality of antenna patterns positioned on an upper surface and a lower surface thereof. The frame substrate includes a frame main body having a frame shape along an outer peripheral portion of the control substrate; and a crosspiece for reinforcement extending across an area defined by an inner periphery of the frame main body. The frame substrate further includes, on lower surfaces of the frame main body and the crosspiece, a plurality of projecting portions that come into contact with the control substrate at a fixed height. The antenna substrate includes, on the lower surface thereof, a plurality of projecting portions that come into contact with the frame main body and the crosspiece at a fixed height.

DESCRIPTION OF EMBODIMENT

Figure 1:
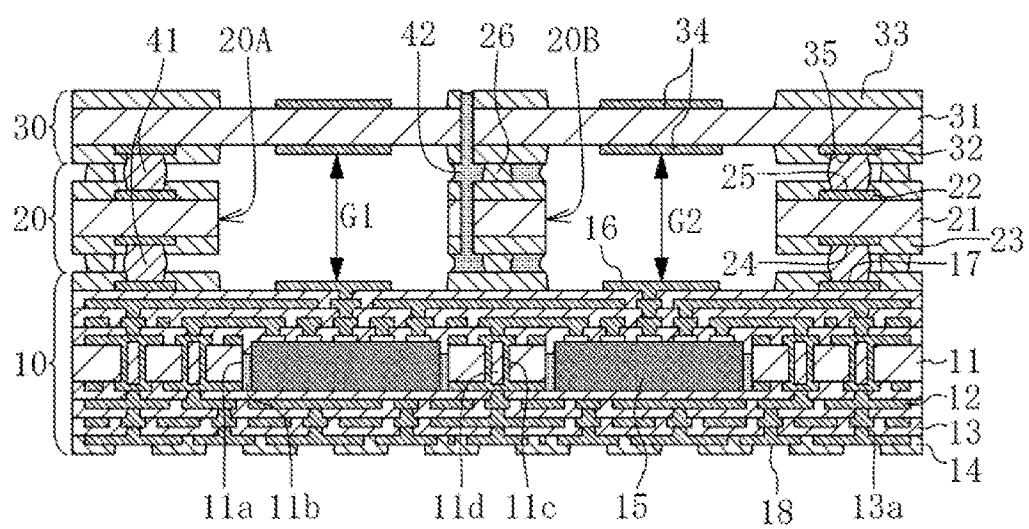
FIG. 1 is a schematic cross-sectional view illustrating a first example of an embodiment of an antenna module of the present disclosure.
Figure 2:
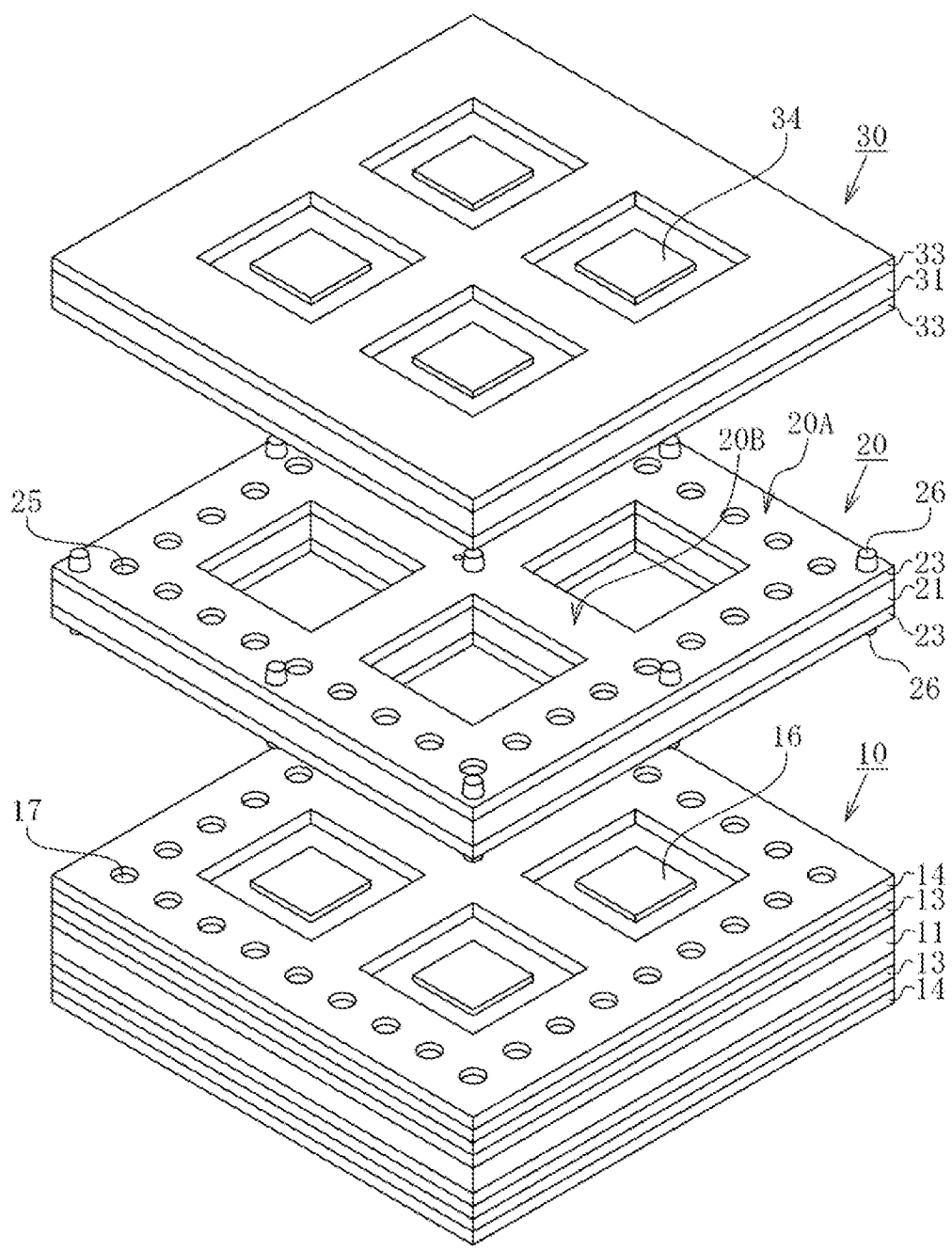
FIG. 2 is a schematic exploded perspective view illustrating the first example of an embodiment of the antenna module of the present disclosure.

A first example of an embodiment of the present disclosure is illustrated in a schematic cross-sectional view in FIG. 1 and in a schematic exploded perspective view in FIG. 2. An antenna module of the present example includes a control substrate 10, a frame substrate 20, and an antenna substrate 30. The control substrate 10, the frame substrate 20, and the antenna substrate 30 are bonded via bonding members 41 and 42. The bonding member 41 is, for example, solder. The bonding member 42 is, for example, a thermosetting resin.

The control substrate 10 is formed by alternately laminating a plurality of electrical conductor layers 12 and insulating layers 13 on upper and lower surfaces of an insulating plate 11. A solder-resist layer 14 is adhered to upper and lower surfaces of the control substrate 10. The control substrate 10 has a square, flat plate shape. A semiconductor element 15 is housed inside the control substrate 10.

The insulating plate 11 is made from an electrical insulation material such as a glass-epoxy resin. The insulating plate 11 has a thickness of about from 0.1 to 0.8 mm. A plurality of hollowed-out portions 11a are formed in a center portion of the insulating plate 11. The hollowed-out portion 11a has a square shape. The semiconductor element 15 is contained within the hollowed-out portion 11a. The semiconductor element 15 is bonded to an inner wall of the hollowed-out portion 11a via an adhesive 11b. The adhesive 11b is made from a thermosetting resin such as an epoxy resin.

A plurality of through-holes 11c are formed in the insulating plate 11. A diameter of the through-hole 11c is about from 75 to 200 μm.

The electrical conductor layer 12 is adhered to the upper and lower surfaces of the insulating plate 11 and inner walls of the through-holes 11c. The electrical conductor layer 12 adhered to the insulating plate 11 is made from a copper foil and a copper plating layer. The electrical conductor layer 12 adhered to the insulating plate 11 has a thickness of about from 5 to 42 μm.

An interior of the through-hole 11c on which the electrical conductor layer 12 is adhered is filled with a hole filling resin 11d. The hole filling resin 11d is formed by dispersing an insulating filler such as silica in a thermosetting resin such as an epoxy resin.

The insulating layer 13 is made from an electrical insulation material obtained by dispersing an insulating filler such as silica in a thermosetting resin such as an epoxy resin. The insulation layer 13 has a thickness of about from 25 to 50 μm. A plurality of via holes 13a are formed in the respective insulating layers 13. The diameter of the via hole 13a is about from 30 to 100 μm.

The electrical conductor layer 12 is adhered to surfaces of the respective insulating layers 13 and inside the via holes 13a. The electrical conductor layer 12 adhered to the insulating layers 13 is made from a copper plating layer. The electrical conductor layer 12 adhered to the insulating layers 13 has a thickness of about from 5 to 42 μm.

The solder-resist layer 14 is made from an electrical insulation material obtained by dispersing an insulating filler such as silica in a thermosetting resin such as an epoxy resin. The solder-resist layer 14 has a thickness of about from 25 to 50 μm.

A plurality of antenna patterns 16 are disposed in a center portion of the upper surface of the control substrate 10. The antenna pattern 16 is made from the electrical conductor layer 12. The antenna pattern 16 is exposed from the solder-resist layer 14 on the upper surface side. The antenna pattern 16 has, for example, a rectangular shape with one side being about from 0.5 to 5 mm. The antenna pattern 16 is electrically connected to an electrode of the semiconductor element 15. Radio waves are transmitted and received between the semiconductor element 15 and an external source via these antenna patterns 16 and antenna patterns 34 described later.

A plurality of frame substrate bonding pads 17 are formed on an outer peripheral portion of the upper surface of the control substrate 10. The frame substrate bonding pad 17 is made from the electrical conductor layer 12. The frame substrate bonding pad 17 is exposed from the solder-resist layer 14 on the upper surface side. The frame substrate bonding pad 17 is circular. A diameter of the frame substrate bonding pad 17 is about from 300 to 600 μm. The frame substrate 20 is bonded to the frame substrate bonding pad 17 via the bonding member 41 made from solder. The bonding member 41 is made from, for example, a tin-silver alloy or a tin-silver-copper alloy.

A plurality of external connection pads 18 are formed on the lower surface of the control substrate 10. The external connection pad 18 is made from the electrical conductor layer 12. The external connection pad 18 is exposed from the solder-resist layer 14 on the lower surface side. The external connection pad 18 is circular. A diameter of the external connection pad 18 is about from 300 to 600 μm. The external connection pad 18 is electrically connected to an electrode of the semiconductor element 15. The external connection pad 18 is connected to an electrical circuit board such as a motherboard (not illustrated).

The frame substrate 20 is formed by laminating an electrical conductor layer 22 on upper and lower surfaces of an insulating plate 21. A solder-resist layer 23 is adhered to upper and lower surfaces of the frame substrate 20. The frame substrate 20 exposes the center portion of the upper surface of the control substrate 10. The frame substrate 20 includes a frame main body 20A having a square frame shape, and a crosspiece 20B for reinforcement that extends across an area defined by an inner periphery of the frame main body 20A. The frame main body 20A is bonded to the control substrate 10 and the antenna substrate 30 via the bonding member 41 made from solder. The crosspiece 20B is bonded to the control substrate 10 and the antenna substrate 30 via the bonding member 42 made from a thermosetting resin.

The insulating plate 21 is made from an electrical insulation material such as a glass-epoxy resin. The insulating plate 21 has a thickness of about from 0.1 to 0.8 mm. The electrical conductor layer 22 laminated on the insulating plate 21 is made from a copper foil or a copper plating layer. The electrical conductor layer 22 has a thickness of about from 5 to 42 µm.

The solder-resist layer 23 is made from an electrical insulation material obtained by dispersing an insulating filler such as silica in a thermosetting resin such as an epoxy resin. The solder-resist layer 23 has a thickness of about from 25 to 50 µm.

A control substrate bonding pad 24 is formed on a lower surface of the frame main body 20A. The control substrate bonding pad 24 is made from the electrical conductor layer 22. The control substrate bonding pad 24 is exposed from the solder-resist layer 23. The control substrate bonding pad 24 is circular. A diameter of the control substrate bonding pad 24 is about from 300 to 600 µm. The control substrate bonding pad 24 is bonded to the frame substrate bonding pad 17 of the control substrate 10 via the bonding member 41 made from solder.

An antenna substrate bonding pad 25 is formed on an upper surface of the frame main body 20A. The antenna substrate bonding pad 25 is made from the electrical conductor layer 22. The antenna substrate bonding pad 25 is exposed from the solder-resist layer 23. The antenna substrate bonding pad 25 is circular. A diameter of the antenna substrate bonding pad 25 is about from 300 to 600 µm. The antenna substrate 30 is bonded to the antenna substrate bonding pad 25 via the bonding member 41 made from solder.

The antenna substrate 30 is formed by laminating an electrical conductor layer 32 on upper and lower surfaces of an insulating plate 31. A solder-resist layer 33 is adhered to upper and lower surfaces of the antenna substrate 30. The antenna substrate 30 has a square, flat plate shape. The antenna substrate 30 is bonded to the upper surface of the frame substrate 20 so as to face the control substrate 10.

The insulating plate 31 is made from an electrical insulation material such as a glass-epoxy resin. The insulating plate 31 has a thickness of about from 25 to 100 µm. The electrical conductor layers 32 laminated on the upper and lower surfaces of the insulating plate 31 are each made from a copper foil or a copper plating layer. The electrical conductor layer 32 has a thickness of about from 5 to 42 µm.

The solder-resist layer 33 is made from an electrical insulation material obtained by dispersing an insulating filler such as silica in a thermosetting resin such as an epoxy resin. The solder-resist layer 33 has a thickness of about from 25 to 50 µm.

The antenna substrate 30 includes a plurality of the antenna patterns 34 along the upper and lower surfaces thereof. The antenna pattern 34 is made from the electrical conductor layer 32. The antenna pattern 34 is exposed from the solder-resist layer 33. The antenna pattern 34 has, for example, a rectangular shape with one side being about from 0.5 to 5 mm. The antenna patterns 34 are each electromagnetically coupled with the antenna patterns 16 of the control substrate 10. Radio waves are transmitted and received between the semiconductor element 15 and an external source via these antenna patterns 34 and the aforementioned antenna patterns 16.

The antenna substrate 30 includes a frame substrate bonding pad 35 on an outer peripheral portion of the lower surface thereof. The frame substrate bonding pad 35 is made from the electrical conductor layer 32. The frame substrate bonding pad 35 is exposed from the solder-resist layer 33. The frame substrate bonding pad 35 is circular. A diameter of the frame substrate bonding pad 35 is about from 300 to 600 µm. The frame substrate bonding pad 35 is bonded to the antenna substrate bonding pad 25 of the frame substrate 20 via the bonding member 41 made from solder.

The semiconductor element 15 is a high-frequency element. High-frequency signals received by the antenna patterns 16 and 34 are input to the semiconductor element 15. Alternatively, the semiconductor element 15 outputs the high-frequency signals transmitted from the antenna patterns 16 and 34.

In the antenna module of the present example, a plurality of projecting portions 26 are formed on the upper and lower surfaces of the frame main body 20A and the crosspiece 20B. The projecting portion 26 is formed on the solder-resist layer 23. The projecting portion 26 may be made from the same material as the solder-resist layer 23. A shape of the projecting portion 26 is, for example, a truncated cone in the present example. A diameter of the projecting portion 26 is about from 50 to 5000 µm. A height of the projecting portion 26 is about from 30 to 100 µm. The projecting portions 26 on the lower surface side come into contact with the upper surface of the control substrate 10 at a fixed height. The projecting portions 26 on the upper surface side come into contact with the lower surface of the antenna substrate 30 at a fixed height.

As described above, in the antenna module of the present example, the frame substrate 20 includes the crosspiece 20B in the area defined by the inner periphery of the frame main body 20A. Further, the plurality of projecting portions 26 that come into contact with the control substrate 10 at a fixed height are formed on the lower surfaces of the frame main body 20A and the crosspiece 20B. The plurality of projecting portions 26 that come into contact with the antenna substrate 30 at a fixed height are provided on the upper surfaces of the frame main body 20A and the crosspiece 20B. With these projecting portions 26, gaps G1 and G2 between the control substrate 10 and the antenna substrate 30 are held constant. Therefore, according to the antenna module of the present example, there is no variation in distance or inclination between the control substrate 10 and the antenna substrate 30. Thus, according to the antenna module of the present example, it is possible to provide an antenna module having stable transmission and reception characteristics.

Next, a method for bonding the control substrate 10, the frame substrate 20, and the antenna substrate 30 of the antenna module of the aforementioned example will be described.

Figure 3:
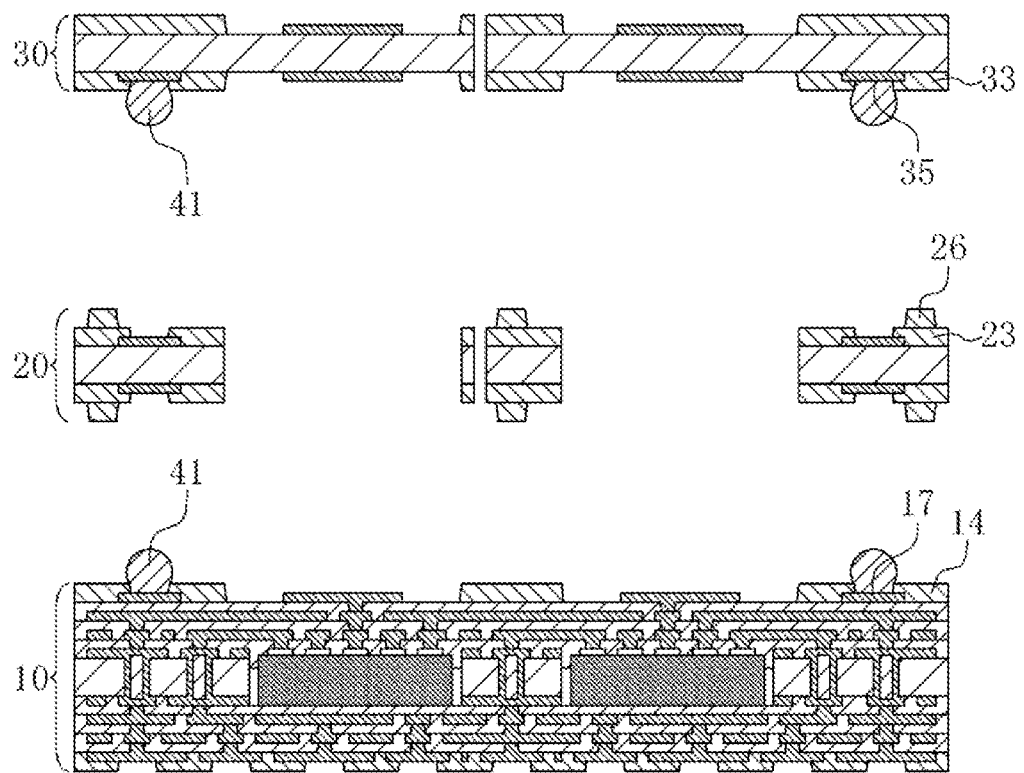
FIG. 3 is a schematic cross-sectional view for explaining a manufacturing method of the first example of an embodiment of the antenna module of the present disclosure.

First, as illustrated in FIG. 3, the control substrate 10, the frame substrate 20, and the antenna substrate 30 are prepared. Note that the bonding member 41 made from solder is fused in advance to the frame substrate bonding pad 17 of the control substrate 10 and the frame substrate bonding pad 35 of the antenna substrate 30. At this time, a protruding height of the bonding member 41 from the solder-resist layers 14 and 33 is about from 10 to 50 µm higher than a protruding height of the projecting portions 26 from the solder-resist layer 23.

Figure 4:
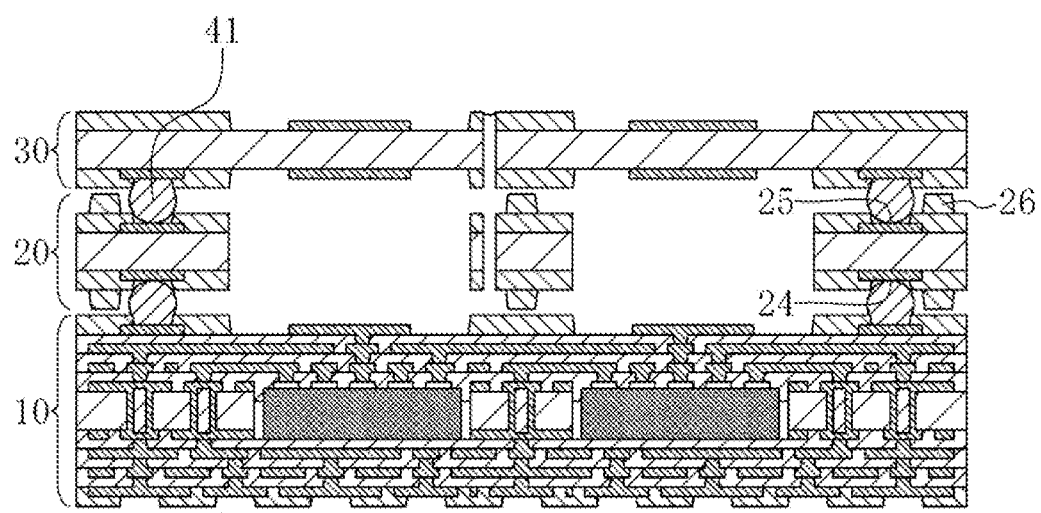
FIG. 4 is a schematic cross-sectional view for explaining the manufacturing method of the first example of an embodiment of the antenna module of the present disclosure.

Next, as illustrated in FIG. 4, the control substrate 10, the frame substrate 20, and the antenna substrate 30 are stacked vertically. At this time, a top portion of the bonding member 41 fused on the control substrate 10 comes into contact with the control substrate bonding pad 24 of the frame substrate 20. A top portion of the bonding member 41 fused on the antenna substrate 30 comes into contact with the antenna substrate bonding pad 25 of the frame substrate 20. At this time, gaps of about from 10 to 50 μm are formed between the projecting portions 26 and the control substrate 10 as well as the antenna substrate 30.

Figure 5:
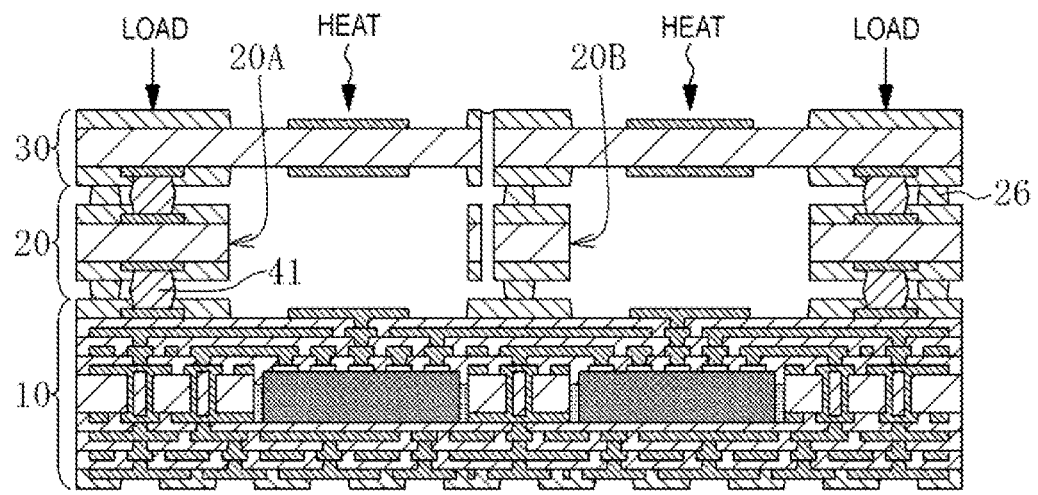
FIG. 5 is a schematic cross-sectional view for explaining the manufacturing method of the first example of an embodiment of the antenna module of the present disclosure.

Next, as illustrated in FIG. 5, the bonding member 41 made from solder is melted by heating while applying a load to the antenna substrate 30 from above. At this time, the projecting portions 26 on the lower surface side of the frame substrate 20 all come into contact with the upper surface of the control substrate 10 at a fixed height. The projecting portions 26 on the upper surface side of the frame substrate 20 all come into contact with the lower surface of the antenna substrate 30 at a fixed height. These projecting portions 26 are cooled while being in contact with the control substrate 10 and the antenna substrate 30 to solidify the bonding member 41. As a result, the control substrate 10, the frame substrate 20, and the antenna substrate 30 are bonded at a predetermined interval corresponding to the height of the projecting portions 26 in the region corresponding to the frame main body 20A.

Figure 6:
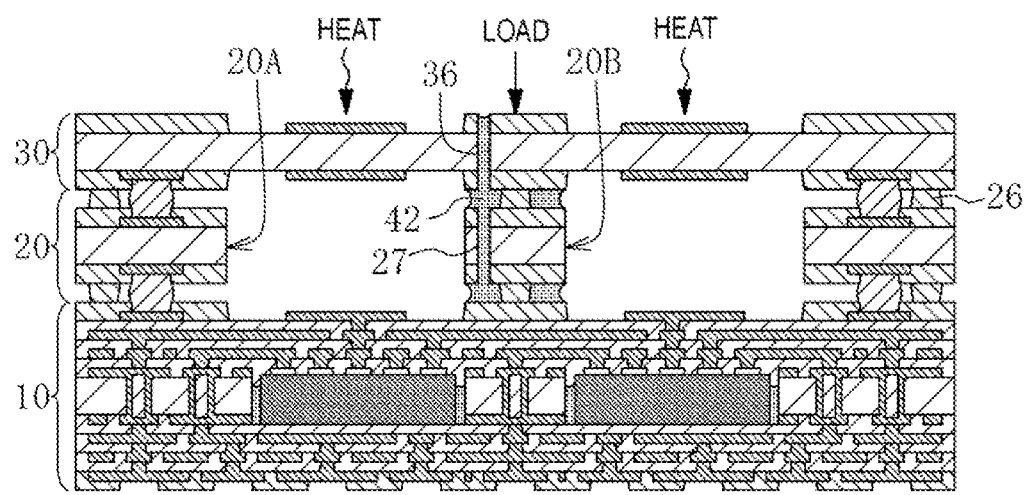
FIG. 6 is a schematic cross-sectional view for explaining the manufacturing method of the first example of an embodiment of the antenna module of the present disclosure.

Next, as illustrated in FIG. 6, the bonding member 42 in liquid form and made from an uncured thermosetting resin is injected between the crosspiece 20B of the frame substrate 20 and the control substrate 10 as well as the antenna substrate 30, and the bonding member 42 is thermally cured by heating while applying a load to the antenna substrate 30 from above.

At this time, the projecting portions 26 on the lower surface side of the frame substrate 20 all come into contact with the upper surface of the control substrate 10 at a fixed height. The projecting portions 26 on the upper surface side of the frame substrate 20 all come into contact with the lower surface of the antenna substrate 30 at a fixed height.

As a result, the control substrate 10, the frame substrate 20, and the antenna substrate 30 are bonded at a predetermined interval corresponding to the height of the projecting portions 26 in a region corresponding to the frame main body 20A and the crosspiece 20B. Thus, there is no variation in distance or inclination between the control substrate 10 and the antenna substrate 30, and an antenna module having stable transmission and reception characteristics is completed.

When the bonding member 42 in liquid form is to be injected, resin injection holes 36 and 27 may be provided in advance in the antenna substrate 30 and the frame substrate 20, and injection may be performed via these resin injection holes 36 and 27.

Figure 7:
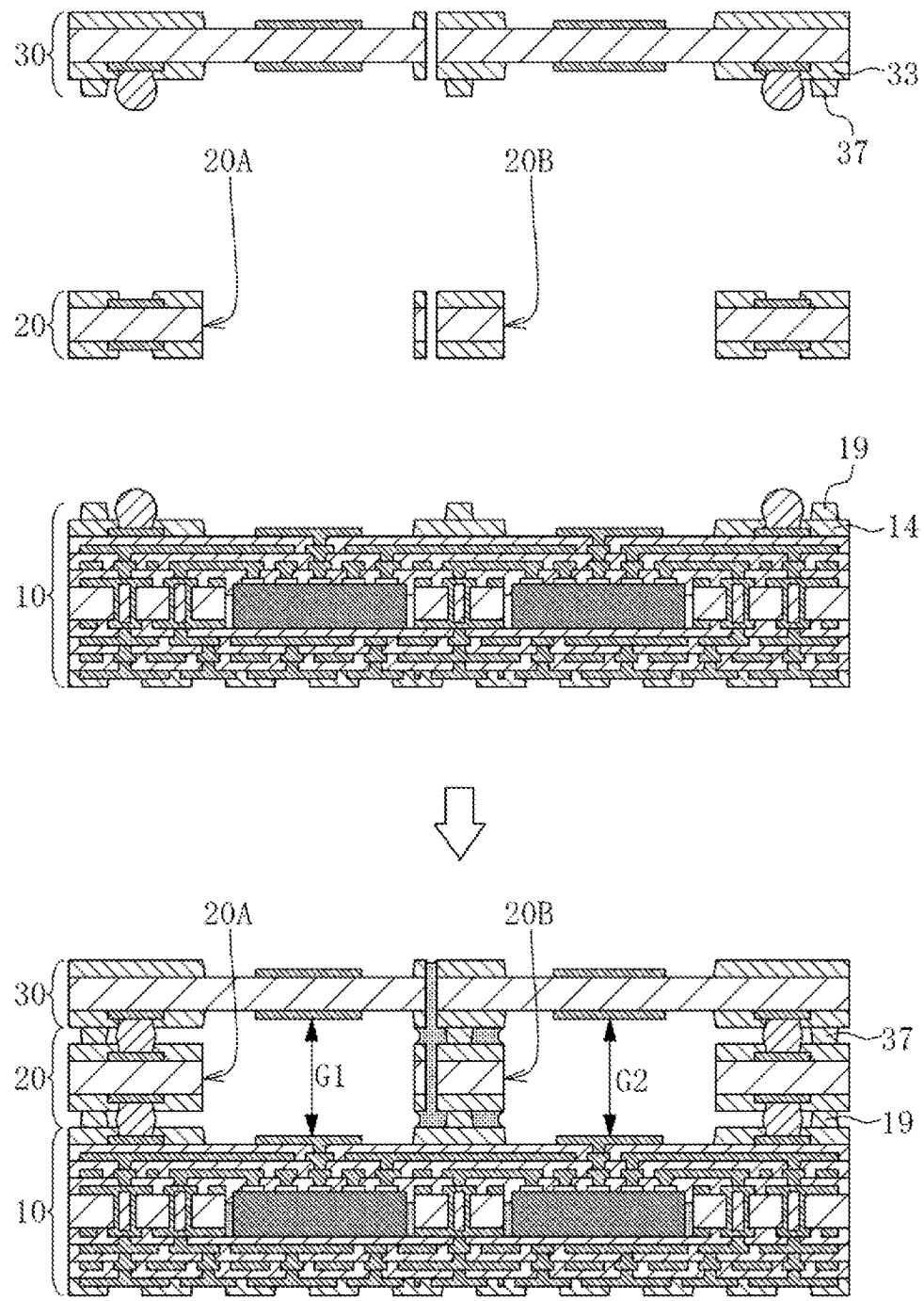
FIG. 7 includes a schematic exploded cross-sectional view and a schematic cross-sectional view illustrating a second example of an embodiment of the antenna module of the present disclosure.

Next, FIG. 7 illustrates a second example of an embodiment of the present disclosure in a schematic exploded cross-sectional view and a schematic cross-sectional view. In the example illustrated in FIG. 7, the same reference signs are assigned to the same locations as in the first example described above, and detailed descriptions thereof will be omitted.

In the present example, projecting portions 19 are provided on the upper surface of the solder-resist layer 14 on the upper surface side of the control substrate 10. Projecting portions 37 are provided on the lower surface of the solder-resist layer 33 on the lower surface side of the antenna substrate 30. These projecting portions 19 and 37 have the same shape and are made from the same material as the projecting portions 26 in the first example described above.

The projecting portions 19 of the control substrate 10 come into contact with the lower surfaces of the frame main body 20A and the crosspiece 20B at a fixed height. The projecting portions 37 of the antenna substrate 30 come into contact with the upper surfaces of the frame main body 20A and the crosspiece 20B at a fixed height.

Thus, in the antenna module of the present example, the control substrate 10 includes, on the upper surface thereof, the plurality of projecting portions 19 that come into contact with the frame main body 20A and the crosspiece 20B at a fixed height. The antenna substrate 30 includes, on the lower surface thereof, the plurality of projecting portions 37 that come into contact with the frame main body 20A and the crosspiece 20B at a fixed height. With these projecting portions 19 and 37, the gaps G1 and G2 between the control substrate 10 and the antenna substrate 30 are held constant. Therefore, according to the antenna module of the present example, there is no variation in distance or inclination between the control substrate 10 and the antenna substrate 30. Thus, according to the antenna module of the present example, it is possible to provide an antenna module having stable transmission and reception characteristics.

Figure 8:
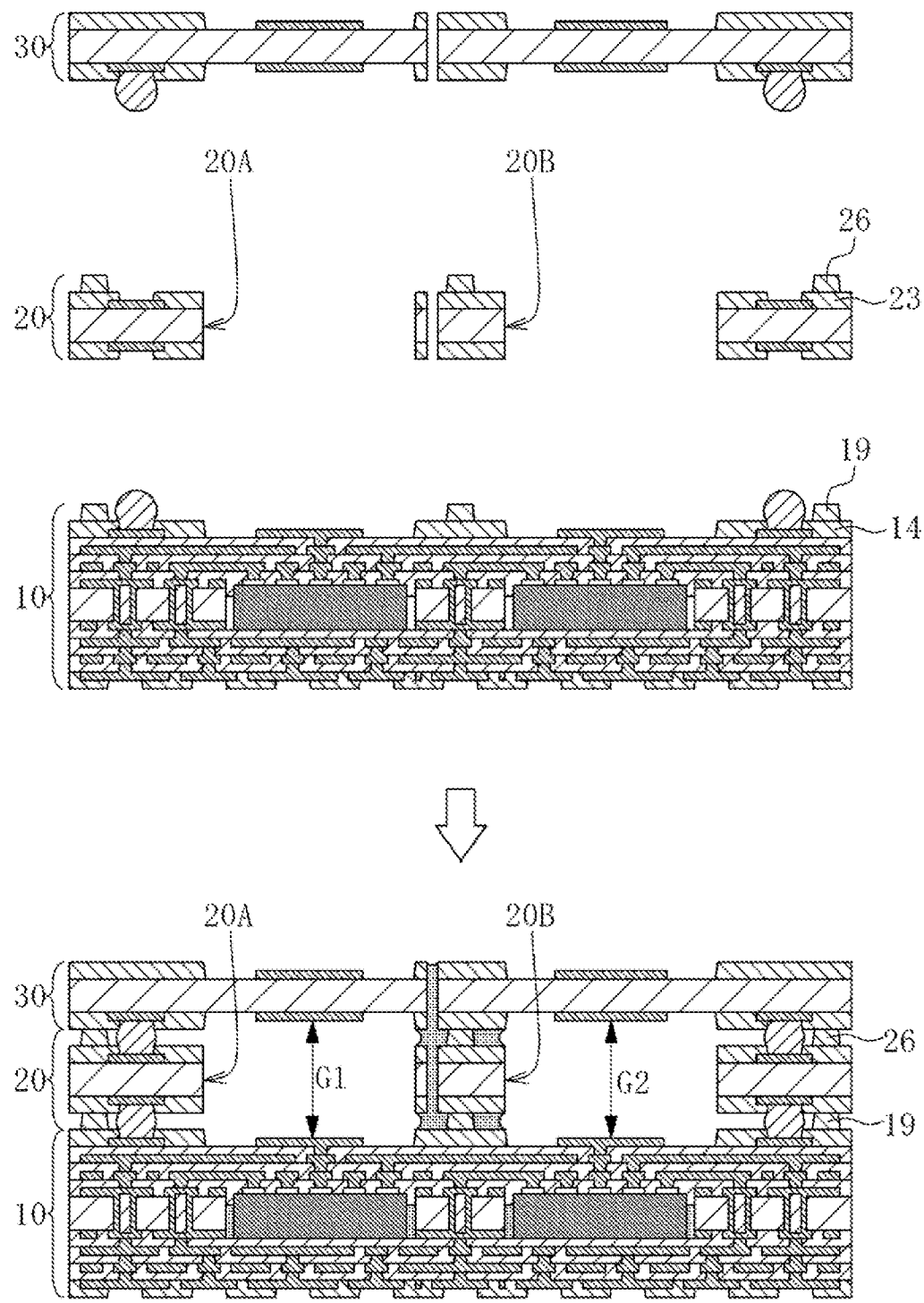
FIG. 8 includes a schematic exploded cross-sectional view and a schematic cross-sectional view illustrating a third example of an embodiment of the antenna module of the present disclosure.

Next, FIG. 8 illustrates a third example of an embodiment of the present disclosure in a schematic exploded cross-sectional view and a schematic cross-sectional view. In the example illustrated in FIG. 8, the same reference signs are assigned to the same locations as in the first example described above, and detailed descriptions thereof will be omitted.

In the present example, the projecting portions 19 are provided on the upper surface of the solder-resist layer 14 on the upper surface side of the control substrate 10. The projecting portions 26 are provided on the upper surface of the solder-resist layer 23 on the upper surface side of the frame substrate 20. These projecting portions 19 and 26 have the same shape and are made from the same material as the projecting portions 26 in the first example described above.

The projecting portions 19 of the control substrate 10 come into contact with the lower surfaces of the frame main body 20A and the crosspiece 20B at a fixed height. The projecting portions 26 of the frame substrate 20 come into contact with the lower surface of the antenna substrate 30 at a fixed height.

Thus, in the antenna module of the present example, the control substrate 10 includes, on the upper surface thereof, the plurality of projecting portions 19 that come into contact with the frame main body 20A and the crosspiece 20B at a fixed height. The frame substrate 20 includes, on the upper surface thereof, the plurality of projecting portions 26 that come into contact with the antenna substrate 30 at a fixed height. With these projecting portions 19 and 26, the gaps G1 and G2 between the control substrate 10 and the antenna substrate 30 are held constant. Therefore, according to the antenna module of the present example, there is no variation in distance or inclination between the control substrate 10 and the antenna substrate 30. Thus, according to the antenna module of the present example, it is possible to provide an antenna module having stable transmission and reception characteristics.

Figure 9:
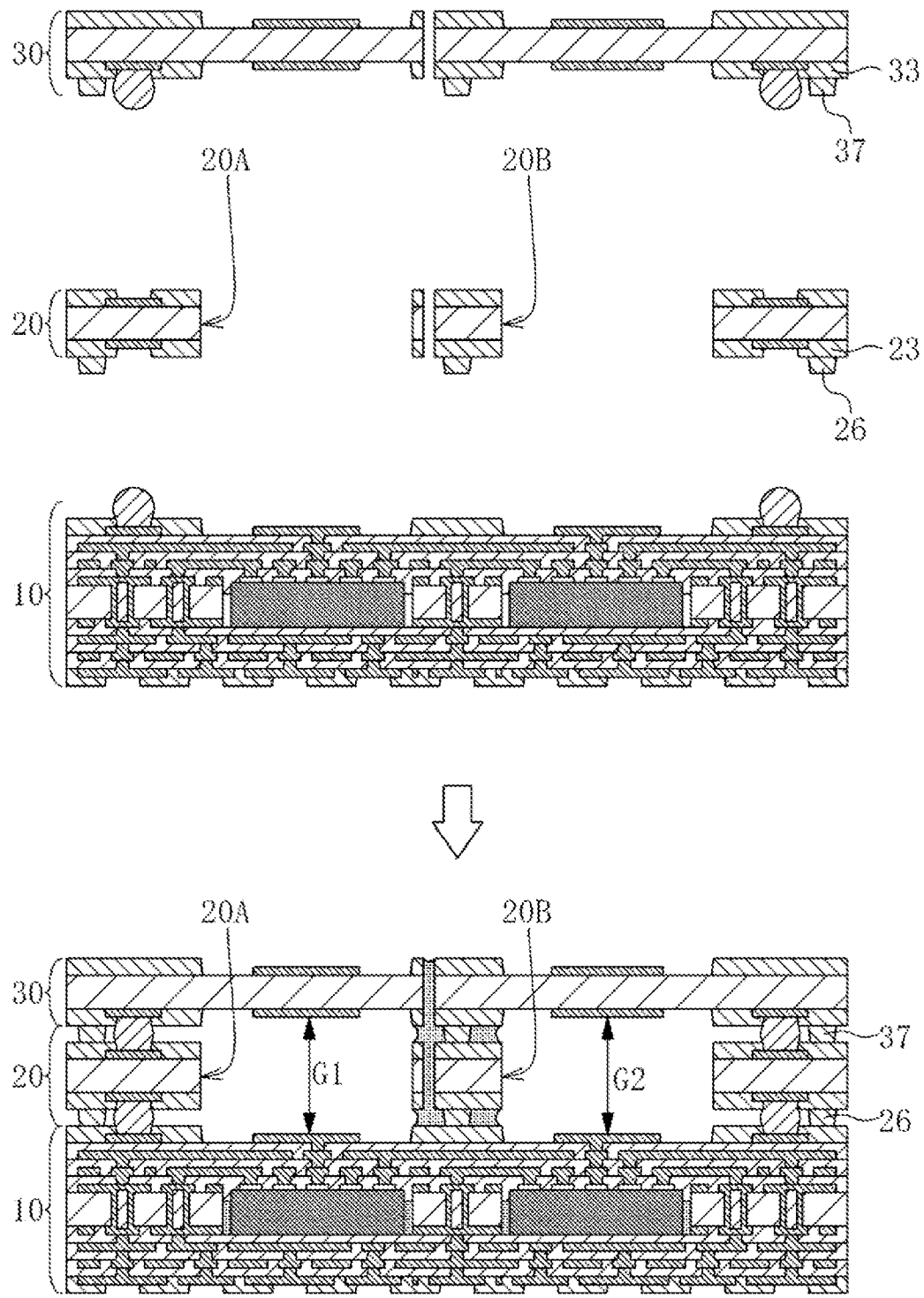
FIG. 9 includes a schematic exploded cross-sectional view and a schematic cross-sectional view illustrating a fourth example of an embodiment of the antenna module of the present disclosure.

Next, FIG. 9 illustrates a fourth example of an embodiment of the present disclosure in a schematic exploded cross-sectional view and a schematic cross-sectional view. In the example illustrated in FIG. 9, the same reference signs are assigned to the same locations as in the first example described above, and detailed descriptions thereof will be omitted.

The projecting portions 26 are provided on the lower surface of the solder-resist layer 23 on the lower surface side of the frame substrate 20. The projecting portions 37 are provided on the lower surface of the solder-resist layer 33 on the lower surface side of the antenna substrate 30. These projecting portions 26 and 37 have the same shape and are made from the same material as the projecting portions 26 in the first example described above.

The projecting portions 26 of the frame substrate 20 come into contact with the upper surface of the control substrate 10 at a fixed height. The projecting portions 37 of the antenna substrate 30 come into contact with the upper surfaces of the frame main body 20A and the crosspiece 20B at a fixed height.

Thus, in the antenna module of the present example, the frame substrate 20 includes, on the lower surface thereof, the plurality of projecting portions 26 that come into contact with the control substrate 10 at a fixed height. The antenna substrate 30 includes, on the lower surface thereof, the plurality of projecting portions 37 that come into contact with the frame main body 20A and the crosspiece 20B at a fixed height. With these projecting portions 26 and 37, the gaps G1 and G2 between the control substrate 10 and the antenna substrate 30 are held constant. Therefore, according to the antenna module of the present example, there is no variation in distance or inclination between the control substrate 10 and the antenna substrate 30. Thus, according to the antenna module of the present example, it is possible to provide an antenna module having stable transmission and reception characteristics.

In the antenna module according to the present disclosure, the frame substrate includes the crosspiece in the area defined by the inner periphery of the frame main body, and between the frame main body/the crosspiece and the control substrate as well as the antenna substrate, projecting portions that come into contact with the opposing control substrate, frame substrate, and antenna substrate are provided at a fixed height. Therefore, there is no variation in distance or inclination between the control substrate and the antenna substrate. As a result, the antenna module of the present disclosure is an antenna module having stable transmission and reception characteristics for high-frequency signals in a desired frequency bandwidth.

Figure 10:
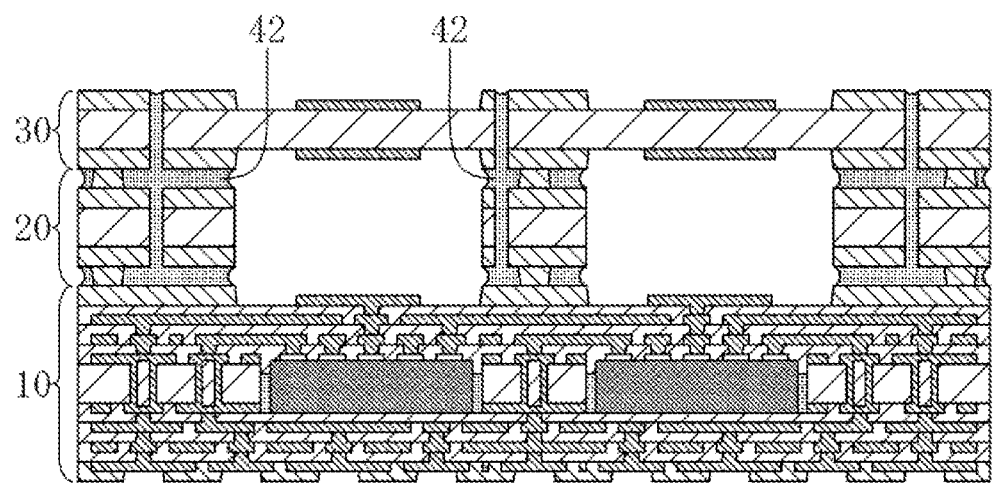
FIG. 10 is a schematic cross-sectional view illustrating a modified example of the first example of an embodiment of the antenna module of the present disclosure.

Note that the present disclosure is not limited to the antenna modules of the respective examples described above, and various changes or improvements can be made within the scope of the claims. For example, in the respective examples described above, the control substrate 10, the frame substrate 20, and the antenna substrate 30 are bonded by two types of bonding members of the bonding member 41 made from solder and the bonding member 42 made from a thermosetting resin. Apart from this, as illustrated in FIG. 10, the control substrate 10, the frame substrate 20, and the antenna substrate 30 may be bonded by only the bonding member 42 made from a thermosetting resin. In this case, the method for bonding the control substrate 10, the frame substrate 20, and the antenna substrate 30 of the antenna module can be made simpler.

In the respective examples described above, the projecting portions 19, 26, and 37 have a truncated cone shape but may have another shape such as the shape of a cylinder, a truncated pyramid, a prism, or a cross-shaped column.

In the respective examples described above, the semiconductor element 15 is housed inside the control substrate 10, but the semiconductor element 15 may be mounted on at least one of the upper surface and the lower surface of the control substrate.

Furthermore, in the respective examples described above, the shapes of the frame substrate bonding pad 17, the external connection pad 18, the control substrate bonding pad 24, the antenna substrate bonding pad 25, and the frame substrate bonding pad 35 may be shapes other than circular.

REFERENCE SIGNS LIST

10 Control substrate
20 Frame substrate
20A Frame main body
20B Crosspiece
19, 26, 37 Projecting portion
30 Antenna substrate
15 Semiconductor element
41, 42 Bonding member
16, 34 Antenna pattern

The invention claimed is:

1. An antenna module, comprising:
a control substrate having a flat plate shape and configured to house or mount a semiconductor element;
a frame substrate bonded to an upper surface of the control substrate via a bonding member, and exposing a center portion of the upper surface of the control substrate; and
an antenna substrate having a flat plate shape, bonded to an upper surface of the frame substrate via a bonding member so as to face the control substrate and provided with a plurality of antenna patterns disposed along an upper surface and a lower surface of the antenna substrate,
wherein the frame substrate comprises:
a frame main body having a frame shape along an outer peripheral portion of the control substrate;
a crosspiece for reinforcement extending across an area defined by an inner periphery of the frame main body; and
on the frame main body and the crosspiece, a plurality of projecting portions that come into contact with the control substrate at a fixed height; and a plurality of projecting portions that come into contact with the antenna substrate at a fixed height, and
wherein the frame substrate is provided with solder-resist layers respectively adhered to the upper and lower surfaces thereof, and the projecting portions are positioned on the solder-resist layers.

2. The antenna module according to claim 1, wherein the projecting portions are made from a same material as the solder-resist layer.

3. The antenna module according to claim 1, wherein the bonding member is made from a thermosetting resin.

4. The antenna module according to claim 1, wherein the projecting portions have another shape such as a shape of a truncated cone, a cylinder, a truncated pyramid, a prism, or a cross-shaped column.

5. The antenna module according to claim 1, wherein the semiconductor element is mounted on at least one of the upper surface and the lower surface of the control substrate.

6. An antenna module, comprising:
a control substrate having a flat plate shape and configured to house or mount a semiconductor element;

a frame substrate bonded to an upper surface of the control substrate via a bonding member and exposing a center portion of the upper surface of the control substrate; and an antenna substrate having a flat plate shape, bonded to an upper surface of the frame substrate via a bonding member so as to face the control substrate, and provided with a plurality of antenna patterns disposed along an upper surface and a lower surface of the antenna substrate, wherein the frame substrate comprises:

a frame main body having a frame shape along an outer peripheral portion of the control substrate; and a crosspiece for reinforcement extending across an area defined by an inner periphery of the frame main body, and the control substrate and the antenna substrate each comprise, on a surface facing the frame substrate, a plurality of projecting portions that come into contact with the frame main body and the crosspiece at a fixed height, and wherein the control substrate and the antenna substrate are each provided with a solder-resist layer adhered to the surface facing the frame substrate, and the projecting portions are positioned on the solder-resist layer.

7. The antenna module according to claim 6, wherein the projecting portions are made from a same material as the solder-resist layer.

8. An antenna module, comprising:

a control substrate having a flat plate shape and configured to house or mount a semiconductor element;

a frame substrate bonded to an upper surface of the control substrate via a bonding member and exposing a center portion of the upper surface of the control substrate; and an antenna substrate having a flat plate shape, bonded to an upper surface of the frame substrate via a bonding member so as to face the control substrate, and provided with a plurality of antenna patterns disposed along an upper surface and a lower surface of the antenna substrate, wherein the frame substrate comprises:

a frame main body having a frame shape along an outer peripheral portion of the control substrate;

a crosspiece for reinforcement extending across an area defined by an inner periphery of the frame main body; and on upper surfaces of the frame main body and the crosspiece, a plurality of projecting portions that come into contact with the antenna substrate at a fixed height, and the control substrate comprises, on the upper surface thereof, a plurality of projecting portions that come into contact with the frame main body and the crosspiece at a fixed height, and wherein the frame substrate and the control substrate are each provided with a solder-resist layer adhered to the surface provided with the projecting portions, and the projecting portions are positioned on the solder-resist layer.

9. The antenna module according to claim 8, wherein the projecting portions are made from a same material as the solder-resist layer.

10. An antenna module, comprising:

a control substrate having a flat plate shape and configured to house or mount a semiconductor element;

a frame substrate bonded to an upper surface of the control substrate via a bonding member and exposing a center portion of the upper surface of the control substrate; and an antenna substrate having a flat plate shape, bonded to an upper surface of the frame substrate via a bonding member so as to face the control substrate, and provided with a plurality of antenna patterns disposed along an upper surface and a lower surface of the antenna substrate, wherein the frame substrate comprises:

a frame main body having a frame shape along an outer peripheral portion of the control substrate;

a crosspiece for reinforcement extending across an area defined by an inner periphery of the frame main body; and on lower surfaces of the frame main body and the crosspiece, a plurality of projecting portions that come into contact with the control substrate at a fixed height, and the antenna substrate comprises, on the lower surface thereof, a plurality of projecting portions that come into contact with the frame main body and the crosspiece at a fixed height, and wherein the frame substrate and the antenna substrate are each provided with a solder-resist layer adhered to the surface provided with the projecting portions, and the projecting portions are positioned on the solder-resist layer.

11. The antenna module according to claim 10, wherein the projecting portions are made from a same material as the solder-resist layer.

* * * * *